(12) United States Patent
Zhang et al.

(10) Patent No.: US 10,176,782 B2
(45) Date of Patent: Jan. 8, 2019

(54) TFT AND MANUFACTURING METHOD THEREOF, ARRAY SUBSTRATE, DISPLAY PANEL AND DIVING METHOD, DISPLAY DEVICE

(71) Applicants: BOE Technology Group Co., Ltd., Beijing (CN); Beijing BOE Display Technology Co., Ltd., Beijing (CN)

(72) Inventors: Bin Zhang, Beijing (CN); Dianzheng Dong, Beijing (CN); Kan Zhang, Beijing (CN); Pengming Chen, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/531,518

(22) PCT Filed: Jul. 1, 2016

(86) PCT No.: PCT/CN2016/088086
§ 371 (c)(1),
(2) Date: May 30, 2017

(87) PCT Pub. No.: WO2017/161731
PCT Pub. Date: Sep. 28, 2017

(65) Prior Publication Data
US 2018/0174552 A1    Jun. 21, 2018

(30) Foreign Application Priority Data
Mar. 25, 2016 (CN) .......................... 2016 1 0177105

(51) Int. Cl.
*G09G 5/10* (2006.01)
*G09G 3/36* (2006.01)
(Continued)

(52) U.S. Cl.
CPC ................. *G09G 5/10* (2013.01); *G09G 3/36* (2013.01); *G09G 3/3648* (2013.01);
(Continued)

(58) Field of Classification Search
CPC ............. G09G 5/10; G09G 2320/0626; G09G 2320/08; G09G 2330/021; G09G 2330/12;
(Continued)

(56) References Cited

U.S. PATENT DOCUMENTS

2013/0169351 A1    7/2013  Chang et al.
2013/0256653 A1*  10/2013  Ahn .................... H01L 29/7869
                                                                257/43
(Continued)

FOREIGN PATENT DOCUMENTS

CN        103187302 A    7/2013
CN        103411669 A    11/2013
(Continued)

OTHER PUBLICATIONS

International Search Report and Written Opinion for International Application No. PCT/CN2016/088086, dated Dec. 27, 2016, 10 pages.

(Continued)

*Primary Examiner* — Dmitriy Bolotin
(74) *Attorney, Agent, or Firm* — Westman, Champlin & Koehler, P.A.

(57) ABSTRACT

The present disclosure discloses a TFT and a manufacturing method thereof, an array substrate, a display panel and a driving method thereof, and a display device, which relates to the field of display technology, and is provided for solving a problem of a larger overall power consumption of the display device. The TFT comprises a substrate; a first gate, a bottom gate dielectric layer and an insulating layer sequen- (Continued)

tially stacked on the substrate; a source and a drain arranged on the insulating layer; and a top gate dielectric layer, a second gate and a passivation layer sequentially stacked on the source, the drain and the insulating layer, wherein the first gate or the second gate is a photosensitive material gate. The TFT and the display panel provided by the present disclosure are applied in the display device.

19 Claims, 7 Drawing Sheets

(51) Int. Cl.
    *H01L 21/02* (2006.01)
    *H01L 27/12* (2006.01)
    *H01L 29/66* (2006.01)
    *H01L 29/786* (2006.01)
    *H01L 31/09* (2006.01)
    *H01L 31/16* (2006.01)

(52) U.S. Cl.
    CPC .. *H01L 21/02532* (2013.01); *H01L 21/02592* (2013.01); *H01L 27/124* (2013.01); *H01L 27/1222* (2013.01); *H01L 27/1262* (2013.01); *H01L 29/6675* (2013.01); *H01L 29/78648* (2013.01); *H01L 29/78663* (2013.01); *H01L 31/09* (2013.01); *H01L 31/161* (2013.01); *G09G 2320/0626* (2013.01); *G09G 2320/08* (2013.01); *G09G 2330/021* (2013.01); *G09G 2330/12* (2013.01); *G09G 2360/144* (2013.01)

(58) Field of Classification Search
    CPC .. G09G 2360/144; G09G 3/36; G09G 3/3648; H01L 21/02532; H01L 21/02592; H01L 27/1222; H01L 27/124; H01L 27/1262; H01L 29/6675; H01L 29/78648; H01L 29/78663; H01L 31/09; H01L 31/161
    See application file for complete search history.

(56) References Cited

U.S. PATENT DOCUMENTS

| | | | |
|---|---|---|---|
| 2014/0061653 A1* | 3/2014 | Kim | H01L 29/66969 257/59 |
| 2014/0117323 A1* | 5/2014 | Ahn | H01L 27/1288 257/40 |
| 2014/0217399 A1 | 8/2014 | Wu et al. | |
| 2015/0021591 A1* | 1/2015 | Kim | H01L 29/7869 257/43 |
| 2016/0232846 A1 | 8/2016 | Xu | |

FOREIGN PATENT DOCUMENTS

| | | |
|---|---|---|
| CN | 103762251 A | 4/2014 |
| CN | 103956142 A | 7/2014 |
| CN | 105573000 A | 5/2016 |

OTHER PUBLICATIONS

English translation of International Search Report and Written Opinion for International Application No. PCT/CN2016/084272, 11 pages.

Second Office Action, including Search Report, for Chinese Patent Application No. 201610177105.3, dated Oct. 12, 2018, 9 pages.

* cited by examiner

TFT AND MANUFACTURING METHOD THEREOF, ARRAY SUBSTRATE, DISPLAY PANEL AND DIVING METHOD, DISPLAY DEVICE

CROSS-REFERENCE TO RELATED APPLICATION(S)

This application is a Section 371 National Stage Application of International Application No. PCT/CN2016/088086, filed on 1 Jul. 2016, which has not yet published and claims priority to Chinese Application No. 201610177105.3, filed on Mar. 25, 2016, entitled "TFT AND MANUFACTURING METHOD THEREOF, ARRAY SUBSTRATE, DISPLAY PANEL AND DIVING METHOD, DISPLAY DEVICE," which are incorporated herein by reference in their entirety.

TECHNICAL FIELD

The present disclosure relates to the field of display technology, and particularly to a TFT (Thin Film Transistor) and a manufacturing method thereof, an array substrate, a display panel and a driving method thereof, and a display device.

BACKGROUND

Nowadays, display devices are increasingly being used in people's work, learning and entertainment. Generally, when a user uses a display device in different scenarios, intensities of ambient light around the display device in different scenarios are different. In order to adjust brightness of a display screen of the display device, it is often required to install an ambient light sensor in the display device, obtain brightness information of the ambient light by the ambient light sensor, provide the brightness information to a processing module of the display device, and adjust the brightness of the display screen of the display device by the processing module according to the obtained brightness information of the ambient light.

However, since the ambient light sensor must be installed in the display device and the display device needs to supply working electric energy to the ambient light sensor, an overall power consumption of the display device is larger.

SUMMARY

The present disclosure provides a Thin Film Transistor TFT, comprising: a substrate; a first gate, a bottom gate dielectric layer and an insulating layer sequentially stacked on the substrate; a source and a drain arranged on the insulating layer; and a top gate dielectric layer, a second gate and a passivation layer sequentially stacked on the source, the drain and the insulating layer, wherein the first gate or the second gate is a photosensitive material gate.

The present disclosure provides a method of manufacturing a Thin Film Transistor TFT, comprising: forming a first gate layer on a substrate, and forming a pattern comprising a first gate on the first gate layer by a patterning process; forming a bottom gate dielectric layer and an insulating layer sequentially on the substrate and the first gate; forming a source/drain layer on the insulating layer, and forming a pattern comprising a source and a drain on the source/drain layer by a patterning process; forming a top gate dielectric layer on the insulating layer, the source and the drain; forming a second gate layer on the top gate dielectric layer, forming a pattern comprising a second gate on the second gate layer by a patterning process, wherein the first gate layer or the second gate layer is a photosensitive material layer; and forming a passivation layer on the top gate dielectric layer and the second gate electrode.

In an embodiment of the present disclosure, the insulating layer is an amorphous silicon layer.

In an embodiment of the present disclosure, the passivation layer is a convex transparent material layer.

The present disclosure provides an array substrate, comprising the TFT as described above.

The present disclosure provides a display panel, comprising the TFT as described above.

In an embodiment of the present disclosure, the TFT is adapted to adjust a current signal passing through the TFT, according to a light intensity of ambient light received by the photosensitive material gate and a first output signal received by a non-photosensitive material gate.

In an embodiment of the present disclosure, the display panel comprises a display area and a test area, the TFT being arranged in the test area, and the test area further comprising a voltage control module connected to the TFT, wherein the TFT is adapted to adjust a current signal passing through the TFT, according to a light intensity of received ambient light and a second output signal of the voltage control module; and the voltage control module is adapted to adjust the second output signal of the voltage control module, according to the current signal passing through the TFT.

In an embodiment of the present disclosure, the voltage control module comprises a current/voltage conversion unit, a processing unit and a power supply management unit, wherein the current/voltage conversion unit is connected to the TFT, and is adapted to convert the current signal passing through the TFT into a voltage signal; the processing unit is connected to the current/voltage conversion unit, and is adapted to output an adjustment signal according to the voltage signal which is output by the current/voltage conversion unit, the adjustment signal being configured for controlling the power supply management unit to adjust the second output signal which is output to the TFT; and the power supply management unit is connected to the processing unit and the TFT respectively, and is adapted to adjust the second output signal which is output to the TFT according to the adjustment signal which is output by the processing unit.

In an embodiment of the present disclosure, the first gate of the TFT is the photosensitive material gate, the second gate is connected to the power supply management unit, a first electrode of the TFT is connected to a data signal terminal, and a second electrode of the TFT is connected to the current/voltage conversion unit, wherein one of the first electrode and the second electrode is the source, and the other is the drain; or, the second gate of the TFT is the photosensitive material gate, the first gate is connected to the power supply management unit, a first electrode of the TFT is connected to a data signal terminal, and a second electrode of the TFT is connected to the current/voltage conversion unit, wherein one of the first electrode and the second electrode is the source, and the other is the drain.

In an embodiment of the present disclosure, the power supply management unit comprises a power supply, an inductance element, a Zener diode and a switch transistor; wherein the power supply is connected to a first terminal of the inductance element, a second terminal of the inductance element is connected to a first electrode of the switch transistor and an input terminal of the Zener diode respectively, an output terminal of the Zener diode is connected to the TFT, a control terminal of the switch transistor is connected to the processing unit, and a second electrode of the switch transistor is grounded.

In an embodiment of the present disclosure, the test area further comprises a liquid crystal capacitor and a common electrode, wherein a first terminal of the liquid crystal capacitor is connected to the second electrode of the TFT, and a second terminal of the liquid crystal capacitor is connected to the common electrode.

In an embodiment of the present disclosure, the processing unit is provided with a communication interface, via which the processing unit communicates with the power supply management unit.

The present disclosure provides a method of driving a display panel, the display panel comprising the TFT as described above, the method comprising: receiving ambient light and a first output signal; controlling a Thin Film Transistor TFT to adjust a current signal passing through the TFT, according to a light intensity of the ambient light and the first output signal; or receiving ambient light and a second output signal of a voltage control module; controlling a TFT to adjust a current signal passing through the TFT, according to a light intensity of the ambient light and the second output signal; and controlling the voltage control module to adjust the second output signal which is output to the TFT, according to the current signal passing through the TFT.

In an embodiment of the present disclosure, the step of controlling the voltage control module to adjust the second output signal which is output to the TFT according to the current signal passing through the TFT comprises: controlling a current/voltage conversion unit to convert the current signal passing through the TFT into a voltage signal; controlling a processing unit to send an adjustment signal to the power supply management unit according to the voltage signal; and controlling the power supply management unit to adjust the second output signal which is output to the TFT according to the adjustment signal.

In an embodiment of the present disclosure, the step of controlling the power supply management unit to adjust the second output signal which is output to the TFT according to the adjustment signal comprises: receiving the adjustment signal, and determining an ON time period and an OFF time period of a switch transistor according to the adjustment signal; and adjusting the second output signal which is supplied from a power supply to the TFT, according to the ON time period and the OFF time period of the switch transistor.

The present disclosure provides a display device, comprising the display panel as described above.

BRIEF DESCRIPTION OF THE DRAWINGS

The drawings described herein are provided to further understand the present disclosure, and constitute a part of the present disclosure. The exemplary embodiments of the present disclosure and the description thereof are intended to explain the present disclosure, and are not to be construed as inappropriate limitations on the present disclosure. In the drawings.

DETAILED DESCRIPTION

Hereinafter, the TFT and the manufacturing method thereof, the array substrate, the display panel and the driving method thereof, and the display device provided by the embodiments of the present disclosure will be described in detail with reference to the accompanying drawings.

Figure 1:
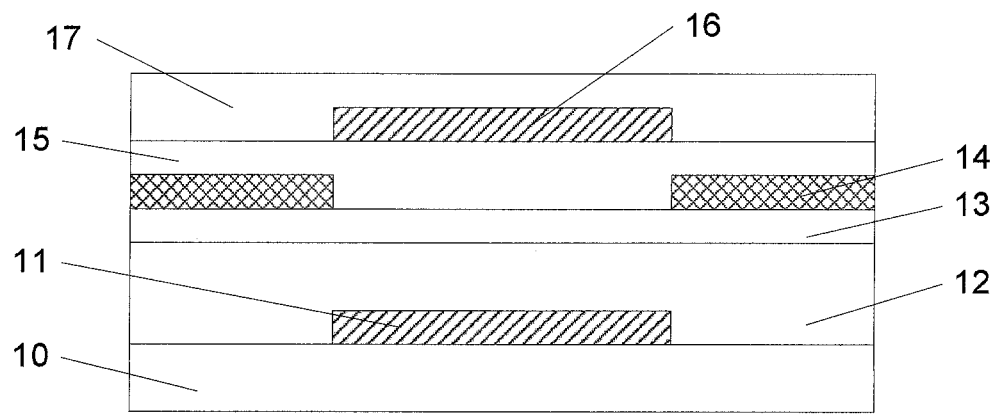
FIG. 1 is a schematic structure diagram of a TFT in an embodiment of the present disclosure.

FIG. 1 is a schematic structure diagram of a TFT in an embodiment of the present disclosure. With reference to FIG. 1, the TFT provided by the embodiment of the present disclosure comprises: a substrate 10; a first gate 11, a bottom gate dielectric layer 12 and an insulating layer 13 sequentially stacked on the substrate 10; a source and a drain 14 arranged on the insulating layer 13; and a top gate dielectric layer 15, a second gate 16 and a passivation layer 17 sequentially stacked on the source, the drain 14 and the insulating layer 13. The first gate 11 is covered by the bottom gate dielectric 12, and the bottom gate dielectric layer 12 is covered by the insulating layer 13. That is, the TFT in the embodiment of the present disclosure is a dual-gate structure, wherein the first gate 11 or the second gate 16 is a photosensitive material gate, i.e., one of the first gate 11 and the second gate 16 is a photosensitive material gate, and the other is a non-photosensitive material gate. In particular, if it is required that the photosensitive material gate is sensitive to visible light, photosensitive material for manufacturing the photosensitive material gate may be Se, Si, BiS and/or Ge etc. If it is required that the photosensitive material gate is sensitive to infrared light, the photosensitive material for manufacturing the photosensitive material gate may be Pb and/or PbSe etc. If it is required that the photosensitive material gate is sensitive to ultraviolet light, the photosensitive material for manufacturing the photosensitive material gate may be ZnO, ZnS and/or CdS etc. The TFT in the embodiment of the present disclosure is equivalent to a TFT connection of the TFT with a photosensitive characteristic and the TFT without the photosensitive characteristic in parallel. The photosensitive material gate is made of the photosensitive material. When there is light irradiating on the photosensitive material gate in the TFT, the TFT is turned on; and the stronger the light is, the greater a turn-on degree of the TFT is, and the greater the current passing through the source and the drain. When the intensity of the ambient light around the display device provided with the TFT in the embodiment of the present disclosure changes, i.e., the intensity of the light irradiated to the photosensitive material gate of the TFT changes, the turn-on degree of the TFT changes, and the current passing through the source and the drain 14 of the TFT also changes, so that the brightness of the display device is changed. The greater the intensity of the ambient light around the display device is, the greater the turn-on degree of the TFT is, the greater the current passing through the source and the drain 14 of the TFT is, and the greater the brightness of the display device is.

Figure 2:
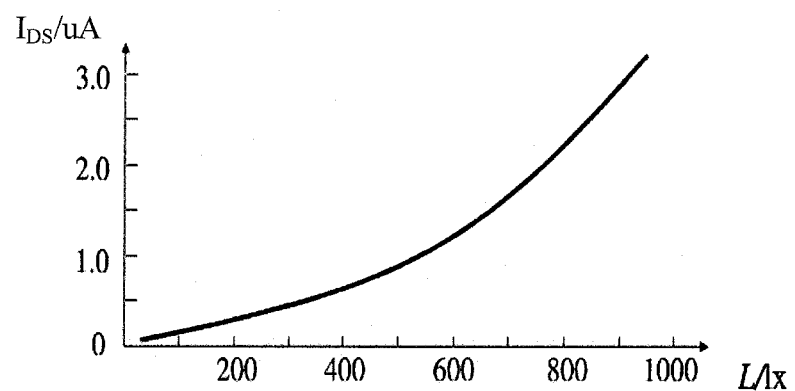
FIG. 2 is a graph showing a relationship between an luminance of light received by a photosensitive material gate and a current passing through a source and a drain of a TFT in an embodiment of the present disclosure.

FIG. 2 is a graph showing a relationship between an intensity of the ambient light received by the photosensitive material gate and a current passing through the source and the drain 14 of the TFT, wherein $I_{DS}$ is a current passing through the source and the drain 14 of the TFT, L is an illumination of the ambient light received by the photosensitive material gate in the TFT, indicating an intensity of the ambient light. As shown in FIG. 2, the greater the intensity of the ambient light is, the greater the current passing through the source and the drain 14 of the TFT is, i.e., the greater the turn-on degree of the TFT is.

The TFT provided by an embodiment of the present disclosure comprises a first gate 11 and a second gate 16, wherein the first gate 11 or the second gate 16 is a photosensitive material gate. Compared to the conventional display device provided with the ambient light sensor, when the photosensitive material gate in the TFT of the embodiment of the present disclosure receives the ambient light, the turn-on degree of the TFT is controlled according to the intensity of the ambient light, so as to change the magnitude of the current passing through the source and the drain 14 of the TFT, further adjusting the brightness of the display screen of the display device provided with the TFT. Since the ambient light sensor does not need to be installed in the display device, the working energy provided for the ambient light sensor may be saved, thereby reducing the power consumption of the display device.

Figure 3:
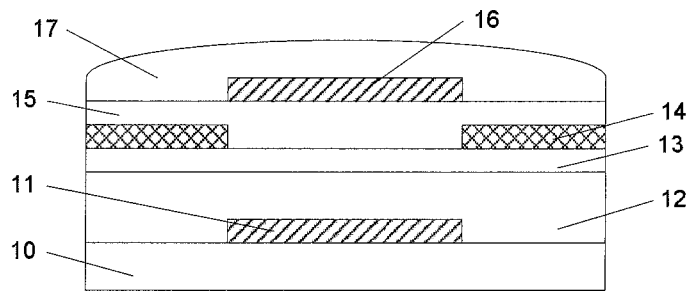
FIG. 3 is another schematic structure diagram of a TFT in an embodiment of the present disclosure.

Alternatively, the substrate 10 may be a glass substrate, the insulating layer 13 may be an amorphous silicon layer, and the insulating layer 13 is made of amorphous silicon, so that the manufacturing process of the insulating layer is most compatible with the manufacturing process of the conventional TFT. In order to ensure that the photosensitive material gate can receive the ambient light, when the second gate 16 is the photosensitive material gate and the first gate 11 is the non-photosensitive material gate, the passivation layer 17 located on the second gate 16 is a transparent material layer. Specifically, the passivation layer 17 may be a transparent material layer having a flat surface or a convex transparent material layer as shown in FIG. 3, so that the ambient light may be focused on the photosensitive material gate, enabling the photosensitive material gate to obtain the light intensity of the ambient light more accurately. When the first gate 11 is the photosensitive material gate and the second gate 16 is the non-photosensitive material gate, respective layers on the first gate 11 are also the transparent material layers, or parts of the respective layers on the first gate 11 are the transparent material layers. Any structures which enable the photosensitive material gate to receive the ambient light fall into the scope of the present disclosure.

Figure 4:
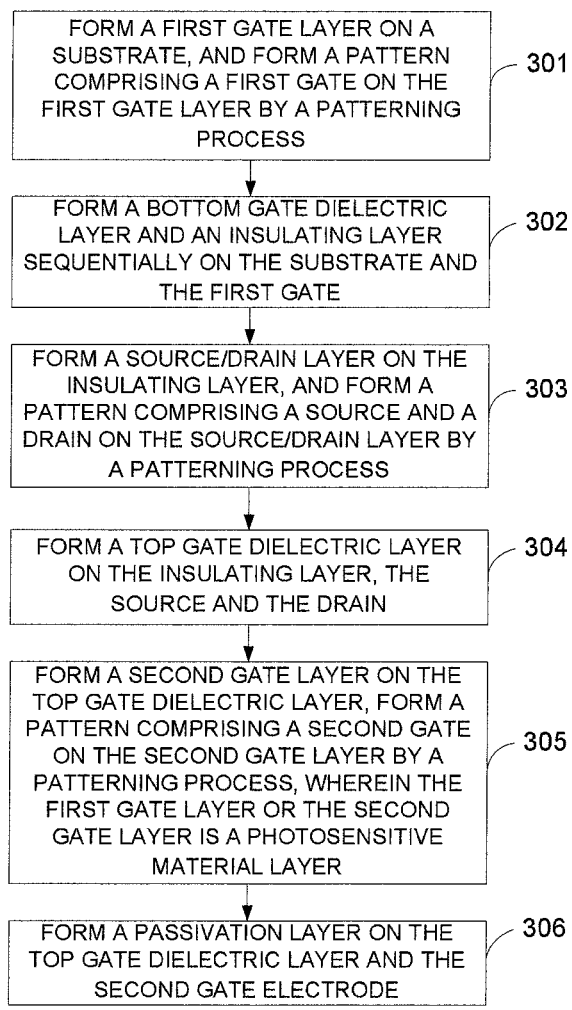
FIG. 4 is a flowchart of a method of manufacturing a TFT in an embodiment of the present disclosure.

With reference to FIG. 4, an embodiment of the present disclosure further provides a method of manufacturing the TFT in the above embodiment, comprising following steps.

Step 301, in which a first gate layer is formed on the substrate, and a pattern comprising a first gate is formed on the first gate layer by a patterning process;

Step 302, in which a bottom gate dielectric layer and an insulating layer are sequentially formed on the substrate and the first gate, wherein the bottom gate dielectric layer is arranged on the first gate, and the insulating layer is arranged on the bottom gate dielectric layer. The insulating layer may particularly be an amorphous silicon layer.

Step 303, in which a source/drain layer is formed on the insulating layer, and a pattern comprising a source and a drain is formed on the source/drain layer by a patterning process.

Step 304, in which a top gate dielectric layer is formed on the insulating layer, the source and the drain.

Step 305, in which a second gate layer is formed on the top gate dielectric layer, a pattern comprising a second gate is formed on the second gate layer by a patterning process, wherein the first gate layer or the second gate layer is a photosensitive material layer.

Step 306, in which a passivation layer is formed on the top gate dielectric layer and the second gate electrode.

In the method of manufacturing the TFT provided by an embodiment of the present disclosure, compared to the conventional display device provided with the ambient light sensor, the first gate layer or the second gate layer in the present disclosure is the photosensitive material layer, so that the first gate or the second gate formed by the patterning process is the photosensitive material gate. When the photosensitive material gate in the manufactured TFT receives the ambient light, the turn-on degree of the TFT is controlled according to the intensity of the ambient light, so as to change the magnitude of the current passing through the source and the drain of the TFT, further adjusting the brightness of the display screen of the display device provided with the TFT. Since the ambient light sensor does not need to be installed in the display device, the working energy provided for the ambient light sensor may be saved, thereby reducing the power consumption of the display device.

An embodiment of the present disclosure provides an array substrate, comprising the TFT in the above embodiment. The TFT in the array substrate has the same advantages as the TFT in the above embodiment, thus description thereof will be omitted here.

An embodiment of the present disclosure provides a display panel, comprising the TFT in the above embodiment. The TFT in the display panel has the same advantages as the TFT in the above embodiment, thus description thereof will be omitted here.

Alternatively, the display panel may have two particular structures as follows.

First, all of TFTs in the display panel are the TFTs with the photosensitive material gates as described in the above embodiment. The TFT in the display panel is adapted to adjust the current signal passing through the TFT, according to the light intensity of the ambient light received by the photosensitive material gate and a first output signal received by the non-photosensitive material gate. That is, each of TFTs in the display panel can adjust the magnitude of the current passing through the source/drain, according to the received ambient light and first output signal.

Figure 5:
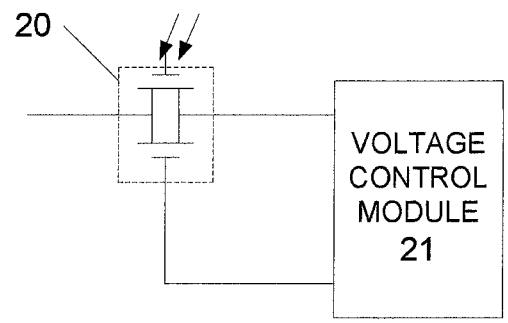
FIG. 5 is a schematic structure diagram of a test area of a display panel in an embodiment of the present disclosure.

Second, as shown in FIG. 5, the display panel may comprise a display area and a test area. The test area comprises the TFT 20 with the photosensitive material gate in the above embodiment and a voltage control module 21, the TFT 20 being connected to the voltage control module 21. The TFT 20 is adapted to adjust the current signal passing through the TFT 20, according to the light intensity of the received light and a second output signal of the voltage control module 21. The voltage control module 21 is adapted to adjust the second output signal of the voltage control module 21, according to the current signal passing through the TFT 20. The second output signal generated by the voltage control module 21 is fed back to the TFT 20 as one of input signals of the TFT 20, another input signal of the TFT 20 being the ambient light.

The display panel provided by the embodiment of the present disclosure comprises the TFT 20 in the above embodiment, compared to the conventional display panel of the display device which is required to be provided with the ambient light sensor, the TFT 20 in the display panel receives the ambient light and the first input signal as input signals, or receives the ambient light and the second output signal of the voltage control module 21 as input signals, and adjusts the current signal passing through the TFT 20 according to the intensity of the ambient light and the first output signal or the second output signal received by the TFT 20. The turn-on degree of the TFT 20 in the present disclosure is collectively controlled by the output signal of the voltage control module 21 and the ambient light. Since the ambient light sensor does not need to be installed in the display device, the working energy provided for the ambient light sensor may be saved, thereby reducing the power consumption of the display device. Furthermore, since the final turn-on degree of the TFT 20 is an overlapped effect of the turn-on degree controlled by the first output signal and the turn-on degree controlled by the light intensity of the ambient light, or an overlapped effect of the turn-on degree controlled by the second output signal and the turn-on degree controlled by the light intensity of the ambient light, a voltage of the first output signal or a voltage of the second output signal may be reduced appropriately if the display screen of the display device is desired to reach a certain brightness, so as to further reduce the power consumption of the display device.

Figure 6:
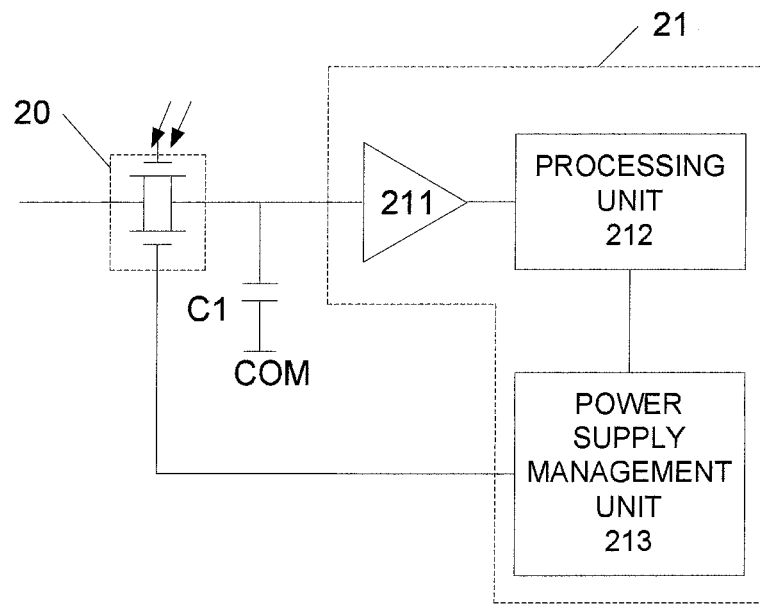
FIG. 6 is another schematic structure diagram of a test area of a display panel in an embodiment of the present disclosure.

FIG. 6 is another schematic structure diagram of a test area of a display panel in an embodiment of the present disclosure. With reference to FIG. 6, a particular structure of the voltage control module 21 in the above embodiment will be described in detail. The voltage control module 21 comprises a current/voltage conversion unit 211, a processing unit 212 and a power supply management unit 213. The current/voltage conversion unit 211 is connected to the TFT 20, and is adapted to convert the current signal passing through the TFT 20 into a voltage signal; the processing unit 212 is connected to the current/voltage conversion unit 211, and is adapted to output an adjustment signal according to the voltage signal which is output by the current/voltage conversion unit 211, the adjustment signal being configured for controlling the power supply management unit 213 to adjust the second output signal which is output to the TFT 20. In particular, the processing unit 212 may be a CPU (Central Processing Unit) or TCON (Timing Controller) etc. The power supply management unit 213 is connected to the processing unit 212 and the TFT 20 respectively, and is adapted to adjust the second output signal which is output to the TFT 20 according to the adjustment signal which is output by the processing unit 212. The power supply management unit 213 may particularly be a PMIC (Power Management Integrated Circuit) etc. In particular, the processing unit 212 may be further provided with a communication interface, via which the processing unit 212 communicates with the power supply management unit 213. For example, the communication interface may be an I2C (Inter-Integrated Circuit, a two-wire serial bus) or a SPI (Serial Peripheral Interface) etc.

When the first gate of the TFT 20 is the photosensitive material gate, the second gate is connected to the power supply management unit 213, a first electrode of the TFT 20 is connected to a data signal terminal, and a second electrode of the TFT 20 is connected to the current/voltage conversion unit 211, wherein one of the first electrode and the second electrode is the source, and the other is the drain. Or, when the second gate of the TFT 20 is the photosensitive material gate, the first gate is connected to the power supply management unit 213, a first electrode of the TFT 20 is connected to a data signal terminal, and a second electrode of the TFT 20 is connected to the current/voltage conversion unit 212, wherein one of the first electrode and the second electrode is the source, and the other is the drain.

The test area in the display panel may further comprises a liquid crystal capacitor C1 and a common electrode COM, wherein the liquid crystal capacitor C1 is an equivalent capacitor of liquid crystal in the display device, a first terminal of the liquid crystal capacitor C1 is connected to the second electrode of the TFT 20, and a second terminal of the liquid crystal capacitor C1 is connected to the common electrode COM. The data signal terminal provides a data signal for a data line in the display device to the liquid crystal capacitor C1 via the TFT 20.

Hereinafter, the second gate of the TFT 20 being the photosensitive material gate is taken as an example for illustration, the second gate of the TFT 20 receives the ambient light so that the TFT 20 is turned on, and the first gate of the TFT 20 receives the output signal of the power management unit 213 in the voltage control module 21, the TFT 20 continues to be turned on, the turn-on degree of the TFT 20 being increased. Based on the TFT 20 being turned on by the second gate receiving the ambient light, the voltage of the output signal provided by the power supply management module can be lower, and thus an expected brightness of the display screen of the display device can be achieved.

Figure 7:
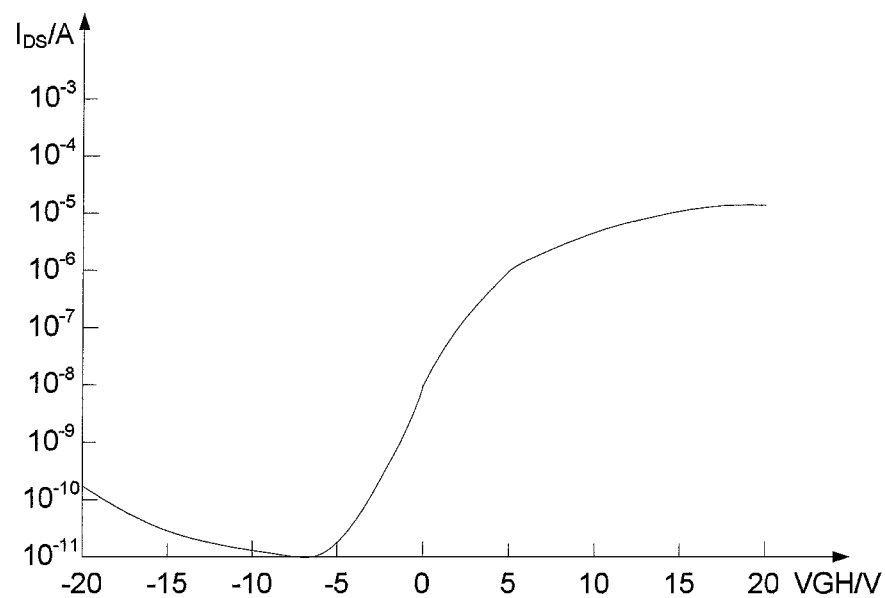
FIG. 7 is a graph showing a relationship between a voltage of an output signal received by a non-photosensitive material gate and a current passing through a source and a drain of a TFT in an embodiment of the present disclosure.

FIG. 7 is a graph showing a relationship between the voltage VGH of an output signal received by the non-photosensitive material gate and the current $I_{DS}$ passing through the source and the drain of the TFT 20. As shown in FIG. 7, in a linear region of the TFT 20, when the voltage VGH of the output signal increases, the current $I_{DS}$ of the source and the drain of the TFT 20 also increases. In the prior art, only one gate is provided in the TFT 20, and the gate is made of the non-photosensitive material. When the display screen of the display device at some instant needs to reach a certain brightness, i.e., when the current passing through the source and the drain of the TFT 20 needs to be a certain magnitude, the turn-on degree of the TFT 20 is controlled by the signal received by the gate. Therefore, the gate of the TFT 20 needs to be supplied with a signal with a higher voltage so that the TFT 20 can be turned on to a desired degree. In the embodiment of the present disclosure, the photosensitive material gate may control the turn-on degree of the TFT 20 according to the light intensity of the received ambient light, the first output signal or the second output signal received by the non-photosensitive material gate can also control the turn-on degree of the TFT 20, and the final turn-on degree of the TFT 20 is an overlap of the turn-on degree of the TFT 20 controlled by the photosensitive material gate and the turn-on degree of the TFT 20 controlled by the non-photosensitive material gate. Thus, a desired turn-on degree of the TFT 20 can be reached, in a case that the non-photosensitive material gate receives the first output signal or the second output signal with a lower voltage.

Figure 8:
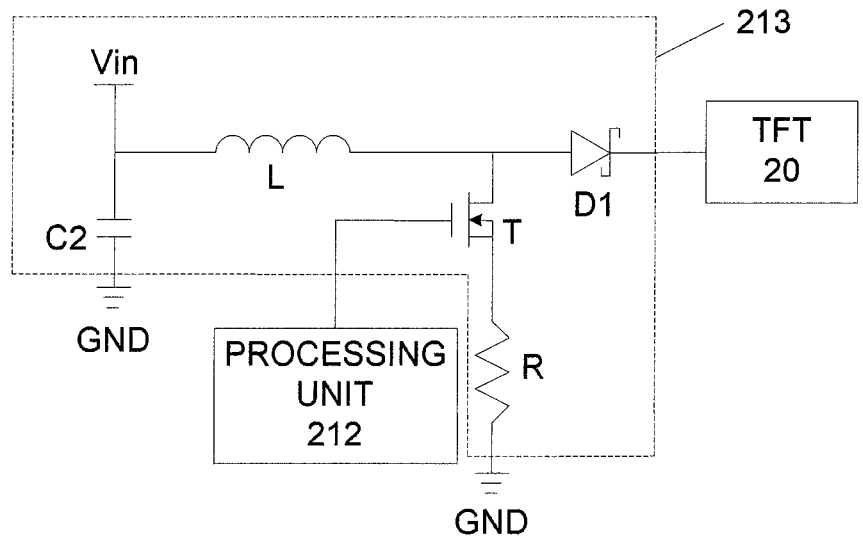
FIG. 8 is a schematic structure diagram of a power supply management unit in an embodiment of the present disclosure.

FIG. 8 is a schematic structure diagram of a power supply management unit in an embodiment of the present disclosure. With reference to FIG. 8, the power management unit 213 in the above embodiment may comprise a power supply Vin, an inductance element L, a Zener diode D1 and a switch transistor T. The power supply Vin is connected to a first terminal of the inductance element L, and a second terminal of the inductance element L is connected to a first electrode of the switch transistor T and an input terminal of the Zener diode D1 respectively, an output terminal of the Zener diode D1 is connected to the TFT 20, a control terminal of the switch transistor T is connected to the processing unit 212, and a second electrode of the switch transistor T is grounded. In particular, the second electrode of the switch transistor T may be connected to ground GND via an equivalent resistor R, the power supply Vin and the first terminal of the inductance element L may also be connected to one terminal of an equivalent capacitor C2, and the other terminal of the equivalent capacitor C2 is connected to the ground GND.

The output signal of the processing unit 212 is input to the control terminal of the switch transistor T, controlling turn-on and turn-off of the switch transistor T. Particularly, an ON time period and an OFF time period of the switch transistor T may be controlled by adjusting a duty cycle of the output signal of the processing unit 212, so as to control a quantity of electricity stored in the inductance element L and a magnitude of the voltage of the second output signal which is supplied by the inductance element L to the TFT 20 via the Zener diode D1. The processing unit 212 may also be provided with a register and a digital-to-analog converter, and adjust the duty cycle of the output signal of the processing unit 212 by rewriting the register in the processing unit 212. The output signal of the processing unit 212 may be generated by the digital-to-analog converter, and may be a PWM (Pulse Width Modulation) signal.

An embodiment of the present disclosure also provides a display device including the display panel as described in the above embodiment. Specifically, the display device may be an e-paper, a mobile phone, a tablet, a TV, a display, a notebook, a digital photo frame, a navigator, and any other product or component having a display function. The display panel in the display device has the same advantages as the display panel in the above embodiment, and thus description thereof will be omitted here.

Figure 9:
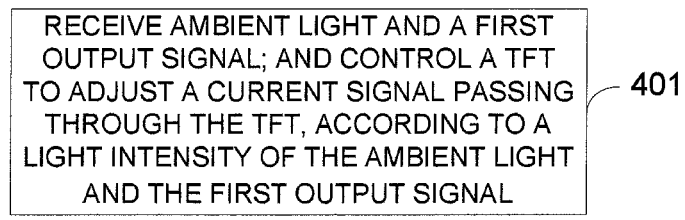
FIG. 9 is a flowchart of a method of driving a display panel in an embodiment of the present disclosure.

FIG. 9 is a flowchart of a method of driving a display panel in an embodiment of the present disclosure. With reference to FIG. 9, an embodiment of the present disclosure further provides a method of driving the above display panel, comprising Step 401.

In Step 401, the ambient light and the first output signal are received; and according to the light intensity of the ambient light and the first output signal, the TFT is controlled to adjust the current signal passing through the TFT, in which the photosensitive material gate in the TFT receives the ambient light, and the first output signal is directly provided by the power supply.

Figure 10:
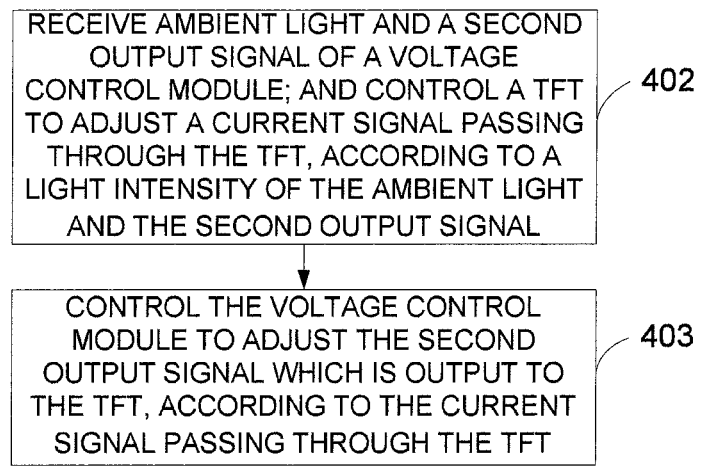
FIG. 10 is another flowchart of a method of driving a display panel in an embodiment of the present disclosure.

FIG. 10 is another flowchart of a method of driving a display panel in an embodiment of the present disclosure. With reference to FIG. 10, an embodiment of the present disclosure further provides a method of driving the above display panel, comprising Steps 402 to 403.

In Step 402, the ambient light and the second output signal of voltage control module are received, and the TFT is controlled to adjust the current signal through the TFT in accordance with the light intensity of the ambient light and the second output signal.

In Step 403, according to the current signal passing through the TFT, the voltage control module is controlled to adjust the second output signal which is output to the TFT.

It should be noted that the details of Step 401 and Step 402 to Step 403 may refer to related description of the display panel, and will not be described here any more. Advantages of the method of driving the display panel has the same advantages as the display panel in the above embodiment, and thus description thereof will be omitted here.

Figure 11:
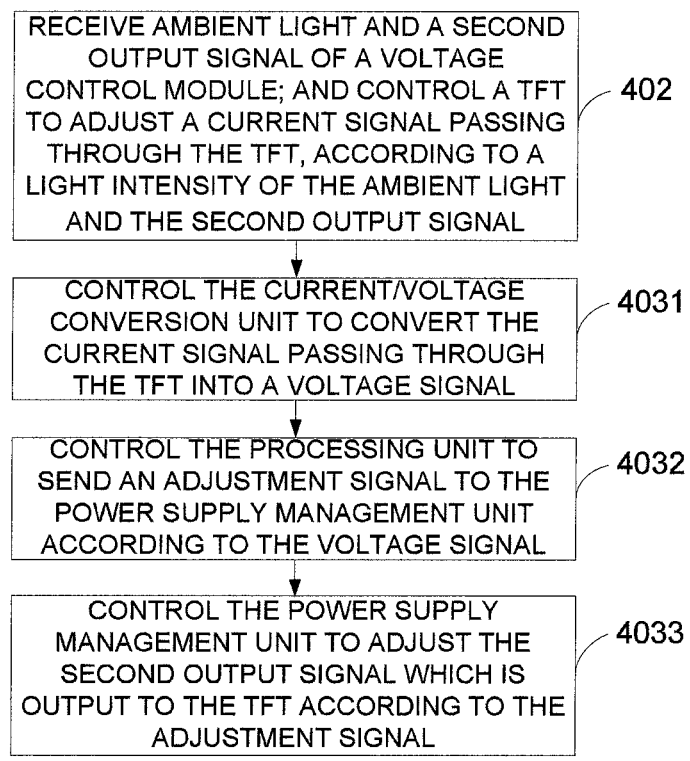
FIG. 11 is yet another flowchart of a method of driving a display panel in an embodiment of the present disclosure.

FIG. 11 is yet another flowchart of a method of driving a display panel in an embodiment of the present disclosure. Specifically, with reference to FIG. 11, Step 403 in the above embodiment may also be refined to Step 4031-Step 4033.

In Step 4031, the current/voltage conversion unit is controlled to convert the current signal passing through the TFT into a voltage signal.

In Step 4032, the processing unit is controlled to send an adjustment signal to the power management unit according to the voltage signal.

In Step 4033, the power management unit is controlled to adjust the second output signal which is output to the TFT according to the adjustment signal.

It should be noted that the details of Steps 4031 to 4033 may refer to related descriptions of the display panel, and will not be described here anymore.

Figure 12:
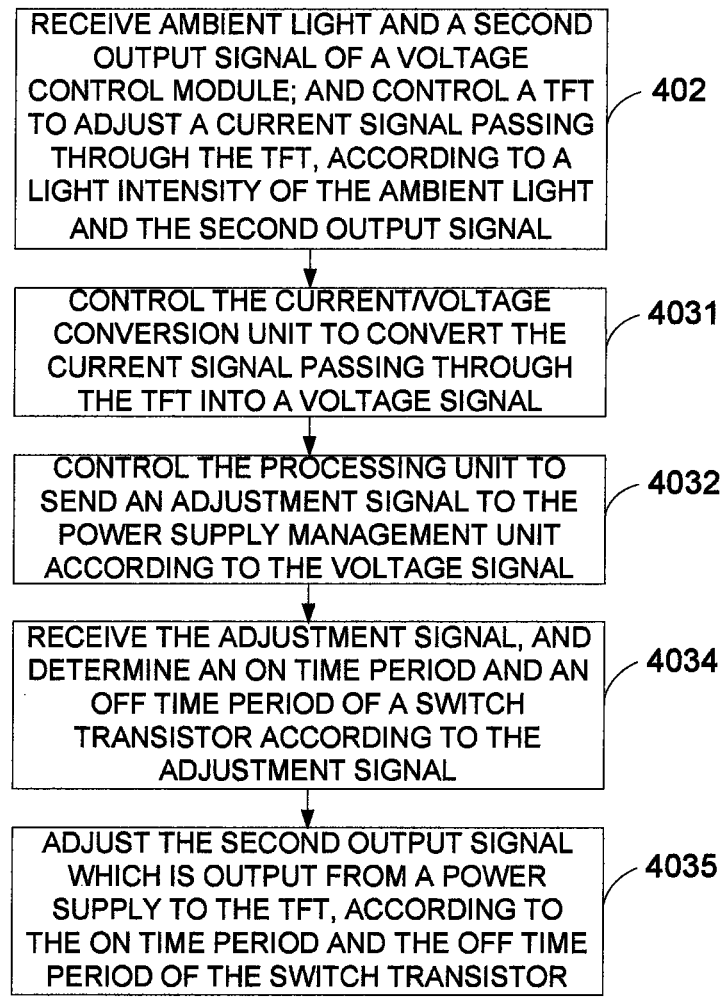
FIG. 12 is further yet another flowchart of a method of driving a display panel in an embodiment of the present disclosure.

FIG. 12 is further yet another flowchart of a method of driving a display panel in an embodiment of the present disclosure. Specifically, with reference to FIG. 12, Step 4033 in the above embodiment may be refined to Step 4034 and Step 4035.

In Step 4034, the adjustment signal is received, and the ON time period and the OFF time period of the switch transistor are determined according to the adjustment signal, in which the adjustment signal is configured for controlling turn-on and turn-off of the switch transistor, so that the ON time period and the OFF time period of the switch transistor may be determined according to the adjustment signal.

In Step 4035, the output signal which is supplied from the power supply to the TFT is adjusted according to the ON time period and the OFF time period of the switch transistor.

It should be noted that the details of Steps 4034 to 4035 may refer to related description of the display panel, and will not be described here anymore.

The respective embodiments of the present disclosure are described in a progressive manner, and the same or similar parts of the embodiments may be referred to from each other. Each of the embodiments focuses on difference from other embodiments. In particular, for the method of manufacturing the TFT, the display device and the method of driving the display panel, since they are substantially similar to the embodiments of the TFT and the display panel, the descriptions thereof are relatively simple, and the related parts may refer to those of the embodiments of the TFT and the display panel.

In the description of the above embodiments, the particular features, structures, materials, or features may be combined in any one or more suitable embodiments or examples in any suitable manners.

It may be understood that the above implementations are only exemplary implementations for illustrating the principles of the present disclosure, but the present disclosure is not limited to these. For the skilled in the art, various variations and improvements may be made without being apart from the sprit and substance of the present disclosure, which also fall into the protection scope of the present disclosure.

We claim:

1. A Thin Film Transistor TFT, comprising:
a substrate;
a first gate, a bottom gate dielectric layer and an insulating layer sequentially stacked on the substrate;
a source and a drain arranged on the insulating layer; and
a top gate dielectric layer, a second gate and a passivation layer sequentially stacked on the source, the drain and the insulating layer,
wherein the first gate or the second gate is a photosensitive material gate.

2. The TFT according to claim 1, wherein the insulating layer is an amorphous silicon layer.

3. The TFT according to claim 1, wherein the passivation layer is a convex transparent material layer.

4. An array substrate, wherein comprising the Thin Film Transistor TFT according to claim 1.

5. A display panel, wherein comprising the Thin Film Transistor TFT according to claim 1.

6. The display panel according to claim 5, wherein the insulating layer is an amorphous silicon layer.

7. The display panel according to claim 5, wherein the passivation layer is a convex transparent material layer.

8. The display panel according to claim 5, wherein the TFT is adapted to adjust a current signal passing through the TFT, according to a light intensity of ambient light received by the photosensitive material gate and a first output signal received by a non-photosensitive material gate.

9. The display panel according to claim 5, wherein the display panel comprises a display area and a test area, the TFT being arranged in the test area, and the test area further comprising a voltage control module connected to the TFT, wherein
the TFT is adapted to adjust a current signal passing through the TFT, according to a light intensity of received ambient light and a second output signal of the voltage control module; and
the voltage control module is adapted to adjust the second output signal of the voltage control module, according to the current signal passing through the TFT.

10. The display panel according to claim 9, wherein the voltage control module comprises a current/voltage conversion unit, a processing unit and a power supply management unit, wherein
the current/voltage conversion unit is connected to the TFT, and is adapted to convert the current signal passing through the TFT into a voltage signal;
the processing unit is connected to the current/voltage conversion unit, and is adapted to output an adjustment signal according to the voltage signal which is output by the current/voltage conversion unit, the adjustment signal being configured for controlling the power supply management unit to adjust the second output signal which is output to the TFT; and
the power supply management unit is connected to the processing unit and the TFT respectively, and is adapted to adjust the second output signal which is output to the TFT according to the adjustment signal which is output by the processing unit.

11. The display panel according to claim 10, wherein the first gate of the TFT is the photosensitive material gate, the second gate is connected to the power supply management unit, a first electrode of the TFT is connected to a data signal terminal, and a second electrode of the TFT is connected to the current/voltage conversion unit, wherein one of the first electrode and the second electrode is the source, and the other is the drain; or
the second gate of the TFT is the photosensitive material gate, the first gate is connected to the power supply management unit, a first electrode of the TFT is connected to a data signal terminal, and a second electrode of the TFT is connected to the current/voltage conversion unit, wherein one of the first electrode and the second electrode is the source, and the other is the drain.

12. The display panel according to claim 10, wherein the power supply management unit comprises a power supply, an inductance element, a Zener diode and a switch transistor; wherein the power supply is connected to a first terminal of the inductance element, a second terminal of the inductance element is connected to a first electrode of the switch transistor and an input terminal of the Zener diode respectively, an output terminal of the Zener diode is connected to the TFT, a control terminal of the switch transistor is connected to the processing unit, and a second electrode of the switch transistor is grounded.

13. The display panel according to claim 10, wherein the processing unit is provided with a communication interface, via which the processing unit communicates with the power supply management unit.

14. The display panel according to claim 9, wherein the test area further comprises a liquid crystal capacitor and a common electrode, wherein a first terminal of the liquid crystal capacitor is connected to the second electrode of the TFT and a second terminal of the liquid crystal capacitor is connected to the common electrode.

15. A method of driving a display panel, according to claim 5, comprising:
applying an ambient light signal to the photosensitive material gate of the first gate and second gate of the TFT; and
applying a gate control signal to the other gate of the first gate and second gate, wherein the gate control signal is a first output signal from a power supply or a second output signal from a voltage control module that controls the second output signal on the basis of a current signal passing through the TFT.

16. The method of driving the display panel according to claim 15 wherein in a case the gate control signal is the second output signal, the gate control signal is obtained by controlling the voltage control module to:
convert the current signal passing through the TFT into a voltage signal;
generate an adjustment signal according to the voltage signal; and
adjust the second output signal according to the adjustment signal.

17. A display device, wherein comprising the display panel according to claim 5.

18. A method of manufacturing a Thin Film Transistor TFT, wherein comprising:
forming a first gate layer on a substrate, and forming a pattern comprising a first gate on the first gate layer by a patterning process;
forming a bottom gate dielectric layer and an insulating layer sequentially on the substrate and the first gate;
forming a source/drain layer on the insulating layer, and forming a pattern comprising a source and a drain on the source/drain layer by a patterning process;
forming a top gate dielectric layer on the insulating layer, the source and the drain;

forming a second gate layer on the top gate dielectric layer, forming a pattern comprising a second gate on the second gate layer by a patterning process, wherein the first gate layer or the second gate layer is a photosensitive material layer; and forming a passivation layer on the top gate dielectric layer and the second gate electrode.

19. The method of manufacturing the TFT according to claim 18, wherein the insulating layer is an amorphous silicon layer.

* * * * *